(12) United States Patent
Feiertag et al.

(10) Patent No.: US 8,580,613 B2
(45) Date of Patent: Nov. 12, 2013

(54) SEMICONDUCTOR CHIP ARRANGEMENT WITH SENSOR CHIP AND MANUFACTURING METHOD

(75) Inventors: Gregor Feiertag, München (DE); Hans Krueger, Munich (DE); Anton Leidl, Hohenbrunn (DE); Alois Stelzl, Munich (DE)

(73) Assignee: Epcos AG, Munich (DE)

( * ) Notice: Subject to any disclaimer, the term of this patent is extended or adjusted under 35 U.S.C. 154(b) by 254 days.

(21) Appl. No.: 12/999,421

(22) PCT Filed: Jun. 16, 2009

(86) PCT No.: PCT/EP2009/057479
§ 371 (c)(1),
(2), (4) Date: May 23, 2011

(87) PCT Pub. No.: WO2009/156308
PCT Pub. Date: Dec. 30, 2009

(65) Prior Publication Data
US 2011/0233690 A1    Sep. 29, 2011

(30) Foreign Application Priority Data
Jun. 17, 2008 (DE) .......... 10 2008 028 757

(51) Int. Cl.
*H01L 21/00* (2006.01)
(52) U.S. Cl.
USPC ..... 438/109; 257/686; 257/723; 257/E23.142
(58) Field of Classification Search
USPC .......... 257/414, 686, 723, E23.142, E23.178, 257/E25.006, E25.013, E31.111, E31.113; 438/109
See application file for complete search history.

(56) References Cited

U.S. PATENT DOCUMENTS

| | | | |
|---|---|---|---|
| 6,178,249 B1 | 1/2001 | Hietanen et al. | |
| 6,316,840 B1 | 11/2001 | Otani | |
| 6,848,306 B2 | 2/2005 | Kundra | |
| 6,998,533 B2 * | 2/2006 | De Samber et al. | 174/521 |
| 7,388,281 B2 | 6/2008 | Krueger et al. | |
| 7,423,335 B2 * | 9/2008 | Yang et al. | 257/680 |
| 7,468,556 B2 * | 12/2008 | Logan et al. | 257/723 |
| 7,564,033 B2 | 7/2009 | Reichenbach et al. | |

(Continued)

FOREIGN PATENT DOCUMENTS

| | | |
|---|---|---|
| DE | 10130131 A1 | 1/2002 |
| DE | 10238523 A1 | 3/2004 |

(Continued)

OTHER PUBLICATIONS

Written Opinion corresponding to International Patent Application No. PCT/EP2009/057479, European Patent Office, dated Sep. 29, 2009, 6 pages.

(Continued)

*Primary Examiner* — Allan R Wilson
(74) *Attorney, Agent, or Firm* — Nixon Peabody LLP

(57) ABSTRACT

On a carrier (1) an adhesion layer (4), an ASIC chip (2) and a sensor chip (3) are arranged one above another. An interchip connection (5) is provided for electrically connecting the chips among one another, and an ASIC connection (6) is provided for externally electrically connecting the circuit integrated in the ASIC chip.

9 Claims, 4 Drawing Sheets

(56) References Cited

U.S. PATENT DOCUMENTS

| | | | |
|---|---|---|---|
| 7,665,207 B2* | 2/2010 | Fraley et al. | 29/834 |
| 7,750,482 B2* | 7/2010 | Pendse | 257/778 |
| 8,304,286 B2* | 11/2012 | Pagaila et al. | 438/109 |
| 2003/0173679 A1* | 9/2003 | Levardo et al. | 257/777 |
| 2007/0158826 A1 | 7/2007 | Sakakibara et al. | |
| 2007/0164402 A1 | 7/2007 | Jung et al. | |
| 2008/0157250 A1* | 7/2008 | Yang et al. | 257/433 |
| 2008/0192967 A1* | 8/2008 | Chan et al. | 381/312 |
| 2008/0246136 A1* | 10/2008 | Haba et al. | 257/686 |
| 2009/0282917 A1* | 11/2009 | Acar | 73/514.02 |
| 2011/0101474 A1 | 5/2011 | Funk | |

FOREIGN PATENT DOCUMENTS

| | | |
|---|---|---|
| DE | 102004010499 A1 | 9/2005 |
| DE | 202007006274 U1 | 5/2007 |
| JP | 10-256414 A | 9/1989 |
| JP | 2004-304189 A | 10/2004 |
| JP | 2006-173280 A | 6/2006 |
| JP | 2007-042336 A | 2/2007 |
| JP | 2007-071821 A | 3/2007 |
| JP | 2007-263677 A | 10/2007 |
| JP | 2008-014875 A | 1/2008 |
| JP | 2008-051686 A | 3/2008 |
| JP | 2008-122134 A | 5/2008 |
| WO | 2004/051745 A2 | 6/2004 |
| WO | 2007/117447 A2 | 10/2007 |
| WO | 2007/149492 A2 | 12/2007 |

OTHER PUBLICATIONS

International Search Report corresponding to International Patent Application No. PCT/EP2009/057479, European Patent Office, dated Sep. 29, 2009, 4 pages.

* cited by examiner

SEMICONDUCTOR CHIP ARRANGEMENT WITH SENSOR CHIP AND MANUFACTURING METHOD

CROSS-REFERENCE TO RELATED APPLICATIONS

This application is a U.S. National Stage of International Application No. PCT/EP2009/057479, filed Jun. 16, 2009, which claims the benefit of Germany Patent Application No. 102008028757.1, filed on Jun. 17, 2008, both of which are incorporated herein by reference in their entireties.

The present invention relates to the packaging of a sensor chip and of an ASIC chip, in such a manner as to meet the requirements for extremely small dimensions of the component.

Pressure sensors, temperature sensors and other semiconductor sensor components are usually mounted in a housing suitable for the relevant sensor. An SMD ceramic housing can be used for this purpose. In the housing, the semiconductor chip is mounted by means of the method of so-called die bonding and subsequently connected by means of bonding wires, if appropriate, to further semiconductor chips in the housing and to the connection contact pads of the housing. Integrated circuits provided for the respective sensor application are integrated in so-called ASIC (application-specific integrated circuit) chips. A semiconductor chip arrangement manufactured by this relatively complicated method takes up a volume that is excessively large for many applications. Therefore, possibilities are sought in respect of how at least one sensor chip and at least one ASIC chip can be mounted together in such a way that a substantially miniaturized arrangement of a mechanically and thermomechanically stable sensor is obtained.

By way of example, PCBs (printed circuit boards) and substrates composed of HTCC (high-temperature cofired ceramics) or LTCC (low-temperature cofired ceramics) are known as carriers for semiconductor chips. Carriers of this type are also provided with external electrical connections.

It is an object of the present invention to specify a miniaturized semiconductor chip arrangement for a sensor chip and an ASIC chip, which arrangement can be manufactured in a simple manner, and also an associated manufacturing method.

This object is achieved by means of the semiconductor chip arrangement comprising the features of claim 1 and, respectively, by means of the method for manufacturing a semiconductor chip arrangement comprising the features of claim 9. Configurations emerge from the respective dependent claims.

In the case of the semiconductor chip arrangement, an ASIC chip having an integrated circuit is arranged on a top side of a carrier. A suitable adhesion layer is provided for fixing. A sensor chip is arranged above the top side of the ASIC chip, said top side facing away from the carrier, and said sensor chip is electrically conductively connected to the integrated circuit by means of an interchip connection. For this purpose, in particular, solder balls (solder bumps) can be provided or a connection—known per se from flip-chip mounting, for example—by means of connection contacts on stud bumps provided therefor can be present. An ASIC connection is present for externally electrically connecting the circuit integrated in the ASIC chip. The ASIC connection can be formed for example by conductor tracks that are electrically conductively connected to plated-through holes and/or redistribution wirings in the carrier.

In the case of the manufacturing method, the ASIC chip is fixed on the carrier by means of an adhesive layer or an adhesive film, for example a polymer film. For the arrangement of the ASIC chip, a cutout can be provided in the top side of the carrier, into which cutout the ASIC chip is inserted. In the case of such embodiments wherein the ASIC chip is wholly or partly embedded into the carrier, conductor tracks of the ASIC connection can be embodied in planar fashion and be structured within the same layer plane. Preferably, the semiconductor chip arrangement is covered on the top side with a covering layer, for example a film laminated thereon. In addition, the semiconductor chip arrangement can be embedded into a molding compound.

In one particular embodiment of the method, a covering layer composed of a decomposable, in particular thermally decomposable, material and also a molding compound are used. The covering layer is uncovered on the top side of the sensor chip or at least in an opening in the molding compound and removed. As a result, an interspace is formed between the sensor chip and the molding compound, such that the sensor chip is mechanically decoupled from the molding compound.

Examples of the semiconductor chip arrangement and of the manufacturing method will be described in greater detail below with reference to the accompanying figures.

Figure 1:
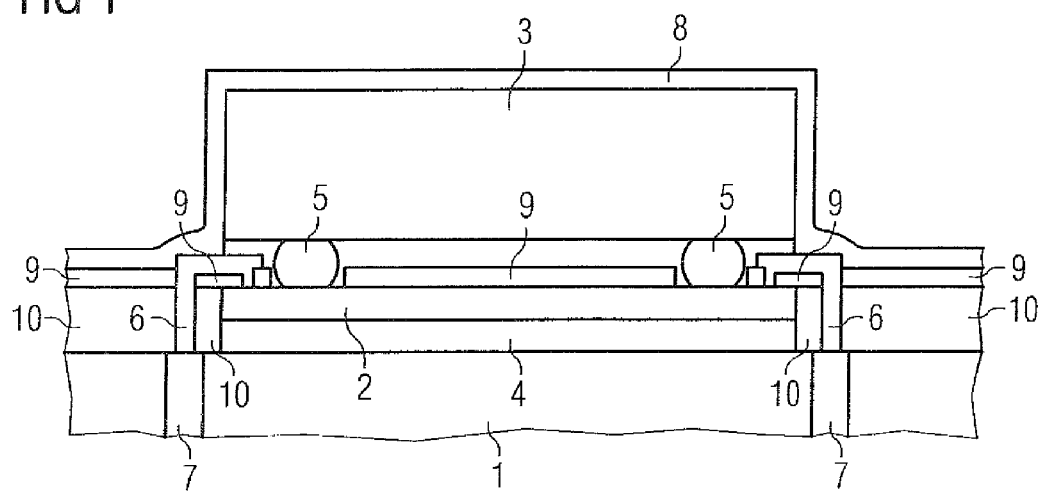
FIG. 1 shows a cross section of an embodiment of the semiconductor chip arrangement.

FIG. 1 shows an embodiment of the semiconductor chip arrangement in cross section. The chips are arranged on a carrier 1, which can be embodied in single-layer or multilayer fashion, if appropriate with integrated redistribution wiring planes and plated-through holes. By way of example, a laminate, in particular a PCB (Printed Circuit Board), or a substrate composed of HTCC (High Temperature Cofired Ceramics) or composed of LTCC (Low Temperature Cofired Ceramics) is suitable as the carrier 1. A possibly thinned ASIC chip 2 is permanently fixed on the carrier 1 by means of an adhesion layer 4. The adhesion layer 4 can be an adhesive layer, for example. A die bonding process known per se can be used for fixing the ASIC chip 2. A die bonding adhesive usually used for this purpose is preferably used as the adhesive. Instead of an adhesive layer, an adhesive film, in particular a customary die bonding film, can be used, which preferably is firstly applied on the underside of the ASIC chip 2. The ASIC chip 2 is then fixed with this film on a top side of the carrier 1.

The material of the adhesion layer 4 is preferably chosen in each case such that the mechanical coupling of the ASIC chip 2 to the carrier 1 is sufficiently small. In particular, the thickness of the adhesion layer 4 and the modulus of elasticity of the material of the adhesion layer 4 should be taken into account in this case. If a very thin ASIC chip 2 is provided, having a typical thickness of approximately 50 μm, the ASIC chip 2 is preferably embedded into an insulating protective layer after die bonding, for example by an insulating layer 9, preferably a film, being laminated thereabove. The cross section in FIG. 1 additionally illustrates a planarization layer 10 laterally enclosing the ASIC chip 2, such that a planar top side is formed. The insulating layer 9 can be arranged on said top side. The planarization layer 10 and the insulating layer 9 can be produced, in particular, as a common layer in the same process step.

The required electrical connections to the ASIC chip can be produced using a technology known per se. Connection contacts for a circuit integrated in the ASIC chip, which connection contacts are provided on the top side of the ASIC chip, are uncovered by the production of openings in the insulating layer 9. That is done for example by means of the method of laser ablation that is known per se. An ASIC connection 6 can subsequently be produced by a procedure in which an electrically conductive material, preferably a metal, is applied, which can be effected by sputtering, for example, and a photographic technology is then employed for structuring. By means of an electroplating process, which is preferably carried out in electroless fashion, the conductor tracks produced in this way can be reinforced as required.

For electrical connection toward the carrier 1, there are situated in the planarization layer 10 through contacts of the ASIC connection 6 to vias 7 (plated-through holes) of the carrier 1. By means of said vias 7 in the carrier 1, the ASIC chip can be electrically connected on the rear side of the carrier 1. Conductor structures for redistribution wiring that is possibly desired can be provided within the carrier 1.

A sensor chip 3 is arranged above a top side of the ASIC chip 2, said top side facing away from the carrier 1. For an electrical connection of the sensor present in the sensor chip to the circuit integrated in the ASIC chip, an electrical connection is provided between the chips, said electrical connection being referred to hereinafter as interchip connection 5. The interchip connection 5 can be formed by solder balls, for example, as illustrated in FIG. 1. Instead, stud bumps can be fitted on the sensor chip, by means of which stud bumps the relevant electrical connections are soldered or welded on connection contact areas of the ASIC chip. The connection contact areas of the ASIC chip 2 are uncovered by means of openings in the insulating layer 9, as can be discerned in FIG. 1. Such an arrangement of the sensor chip 3 on the ASIC chip 2 can be manufactured by method steps of a manufacturing technology known per se, for example by means of flip-chip mounting known per se.

The semiconductor chip arrangement is preferably protected against environmental influences by means of a covering layer 8. By means of the covering layer 8, the semiconductor chip arrangement can, if appropriate, be hermetically sealed toward the outside. An electrical shield (not illustrated in FIG. 1) can additionally be provided, which is produced for example by the sputtering of an electrically conductive material or of electrically conductive materials, which, if appropriate, are electrolytically reinforced, and is electrically connected; by way of example, an adhesion layer composed of Ti or W and typically having a thickness of approximately 100 nm is provided with a copper layer having a thickness of at least 200 nm. Before the shield is applied, the covering layer 8 and the insulating layer 9 can be selectively removed in order that the shield is contact-connected to the housing ground. An inscribable layer (for example composed of black nickel) can be applied on the top side, as required. If a hermetically sealing housing is not provided, a non-conductive or semiconducting layer can be sputtered onto the covering layer 8 as a basis for an inscription by means of a laser.

The construction described has a high flexibility, such that the chips arranged therein are largely protected against mechanical or thermomechanical strains such as can occur during a deformation of the carrier. The connections between the ASIC chip and the carrier can also be configured in such a way that they have a high thermomechanical stability.

Figure 2:
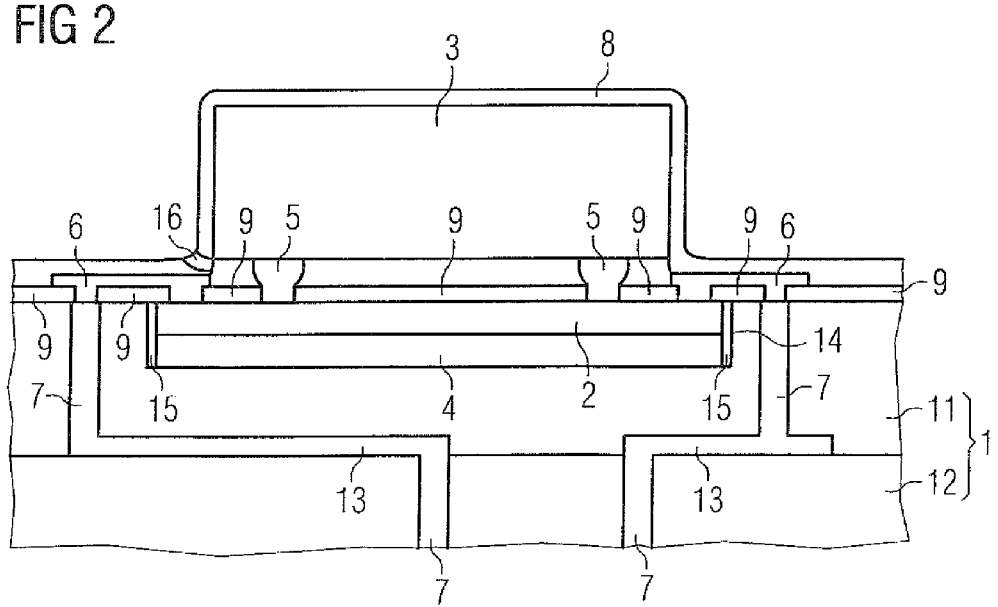
FIG. 2 shows a cross section of a further embodiment of the semiconductor chip arrangement.

FIG. 2 shows a cross section through a further embodiment. This example also illustrates schematically that the carrier 1 can be constructed in multilayer fashion. In the example illustrated, the carrier 1 comprises an upper, first carrier layer 11 and a second carrier layer 12, although if appropriate even further carrier layers can be present. The vias 7 lead to conductor tracks of a redistribution wiring plane 13 arranged between the carrier layers 11, 12. By means of such a redistribution wiring plane 13 it is possible for the conductor tracks of the ASIC connection 6, by means of which, in the examples illustrated, a plurality of connection contacts of the ASIC chip 2 are connected separately from one another, to be connected in any desired manner to connection contact areas arranged on the underside of the carrier 1 for an external electrical connection. Independently of the arrangement of the connection contacts on the ASIC chip 2, therefore, these connection contact areas on the rear side of the carrier 1 can be present in any desired arrangement, in principle. The use of such a multilayer carrier is also possible in the other embodiments, but for the latter only a single-layer embodiment of the carrier is respectively illustrated in the figures.

In the embodiment according to FIG. 2, the ASIC chip 2 is not arranged on a planar top side of the carrier 1, but rather in a cutout 14 in the carrier 1, which cutout can be dimensioned, in particular, such that the rest of the top side of the carrier 1 forms a plane together with the top side of the ASIC chip 2, said top side of the ASIC chip 2 facing away from the carrier. That is advantageous since, in this case, the ASIC connection 6 can be formed by planar conductor tracks on the planar top side. That also simplifies the structuring of the ASIC connection 6 composed of a conductive layer to form conductor tracks that produce the connection to the vias 7 in the carrier 1. On the top side of the ASIC chip 2 it is possible to provide an insulating layer 9 similar to the insulating layer of the embodiment in FIG. 1. A gap or interspace 15 between the ASIC chip 2 and the sidewall of the cutout 14 may be desirable in order to bring about the best possible mechanical decoupling of the ASIC chip 2 from the carrier 1. The interspace 15 is bridged by the insulating layer 9; for this purpose, it is advantageous, in particular, if the insulating layer 9 is formed by a laminated-on film. The top side of the ASIC chip 2, said top side facing away from the carrier 1, and the top side of the carrier 1 that is present laterally with respect to the cutout 14 are preferably arranged approximately in the same plane. Small height differences of up to typically approximately 100 μm can be compensated for by the insulating layer 9. If the cutout 14 has a suitably dimensioned depth, in this embodiment a substantially planar top side is thus obtained even without a planarization layer.

If the sensor chip 3, as in the case of a pressure sensor integrated therein, requires an open connection to the surroundings, an opening 16 is provided in the covering layer 8 at a suitable location, wherein said opening can be produced by the use of a laser, for example. An opening 16 of this type can also be provided in the other embodiments.

Figure 3:
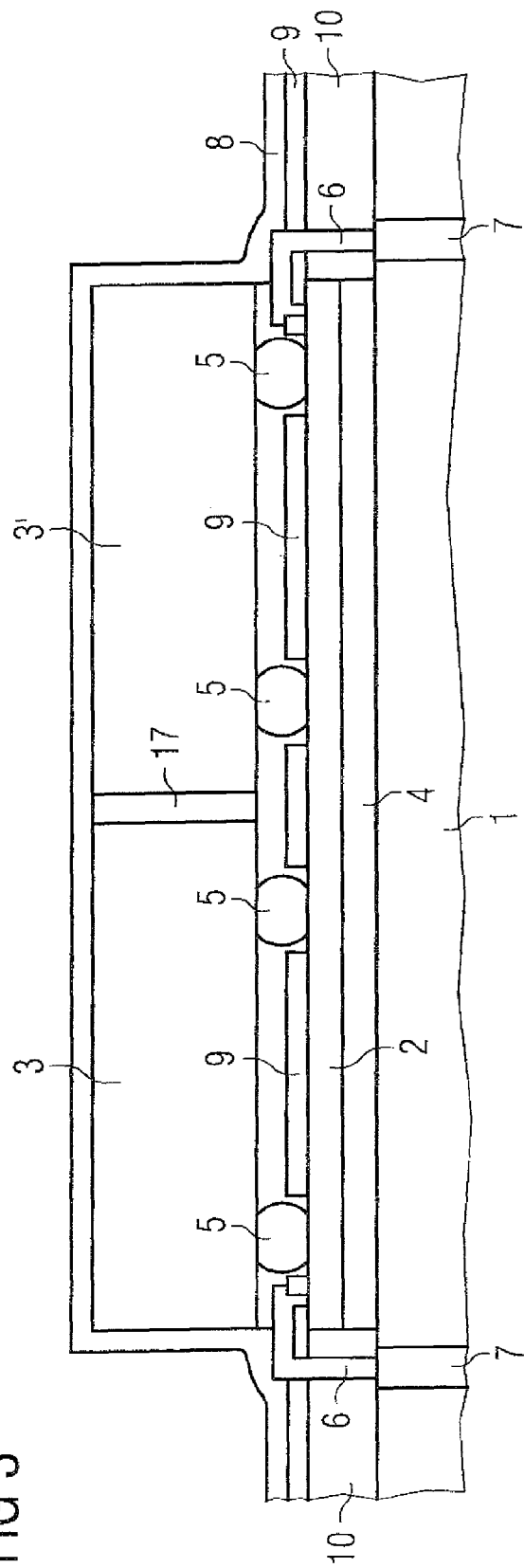
FIG. 3 shows a cross section of a further embodiment of the semiconductor chip arrangement with two sensor chips.

FIG. 3 shows a cross section of a further embodiment, wherein the semiconductor chip arrangement comprises two sensor chips 3, 3'. The lateral arrangement of the sensor chips that is illustrated in FIG. 3 is preferred. In principle, however, it is also possible to stack the sensor chips one above the other. For reasons of saving space, an interspace 17 present between the sensor chips 3, 3' is chosen to be as small as possible, although an interspace 17 that is not too narrow may be desirable in order to leave between the sensor chips 3, 3' a certain clearance that guarantees a sufficient flexibility of the arrangement. The relative dimensions of the chips are chosen such that substantial miniaturization of the sensor chip arrangement is achieved in this embodiment as well. The remaining components of this embodiment correspond to the components of the embodiment in FIG. 1 and are provided with the same reference symbols. An arrangement of a plurality of sensor chips is possible in a corresponding manner in the other embodiments as well. In particular, a plurality of sensor chips can also be provided in the embodiment in accordance with FIG. 2, wherein the ASIC chip 2 is arranged in a cutout 14 in the carrier 1. For this purpose, separate cutouts can be provided, or the cutout is provided with larger dimensions and accommodates two or more ASIC chips.

Figure 4:
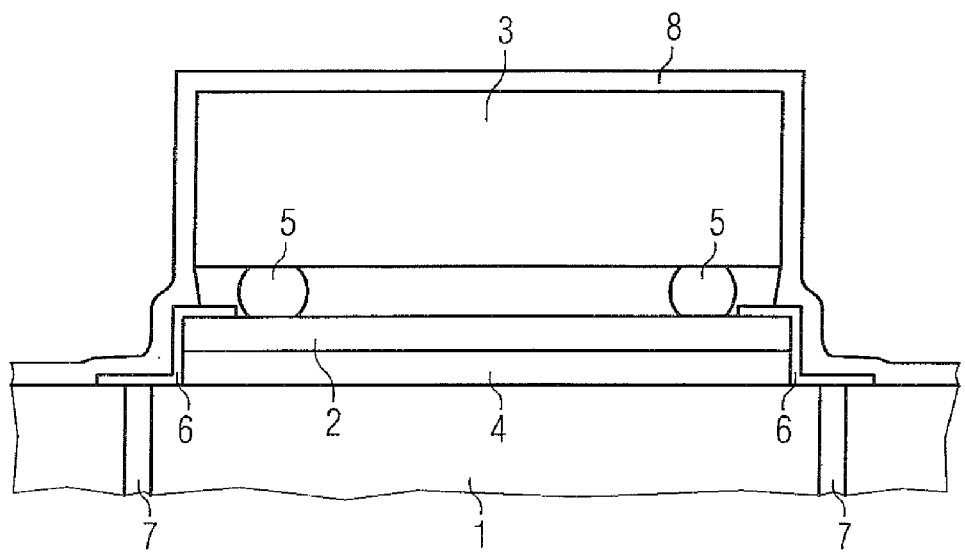
FIG. 4 shows a cross section of a further embodiment of the semiconductor chip arrangement with a 3D wiring.

FIG. 4 shows a cross section through a further embodiment, wherein the ASIC chip 2 is connected to the carrier 1 by means of a 3D wiring. That means that the ASIC chip 2 and the adhesion layer 4 form a layer stack on the top side of the carrier 1 and the ASIC connection 6 is led down at the flanks of said layer stack onto the top side of the carrier 1, where the ASIC connection 6 makes contact, for example, with the vias 7 of the carrier 1. In this embodiment, too, a covering layer 8 is preferably present above the sensor chip 3. In this example, too, the interchip connection 5 is formed with solder balls; instead, stud bumps or other customary electrical connections can be provided.

In the embodiment in accordance with FIG. 4, it is advantageous, in particular, if the adhesion layer 4 used is a film, for example a polymer layer having a typical thickness of approximately 25 μm to 75 μm. Such an adhesive film is fitted on the underside of the ASIC chip 2 before the ASIC chip 2 is mounted on the carrier 1. That preferably takes place whilst still in the wafer assemblage. The wafer provided with the adhesive film is divided into the individual components, which are then fixed on the carrier 1 in the manner illustrated in FIG. 4. An insulating layer can be laminated on the top side of the ASIC chip 2 in such a way that the insulating layer covers the top side of the ASIC chip 2, the side edge of the ASIC chip 2 and the adhesion layer 4 and also the carrier 1 outside the ASIC chip 2. For the purpose of contact-connecting the connections of the ASIC chip 2 and the interchip connections 5, the insulating layer can be selectively removed at the contact locations on the ASIC chip 2 and the carrier 1.

Figure 5:
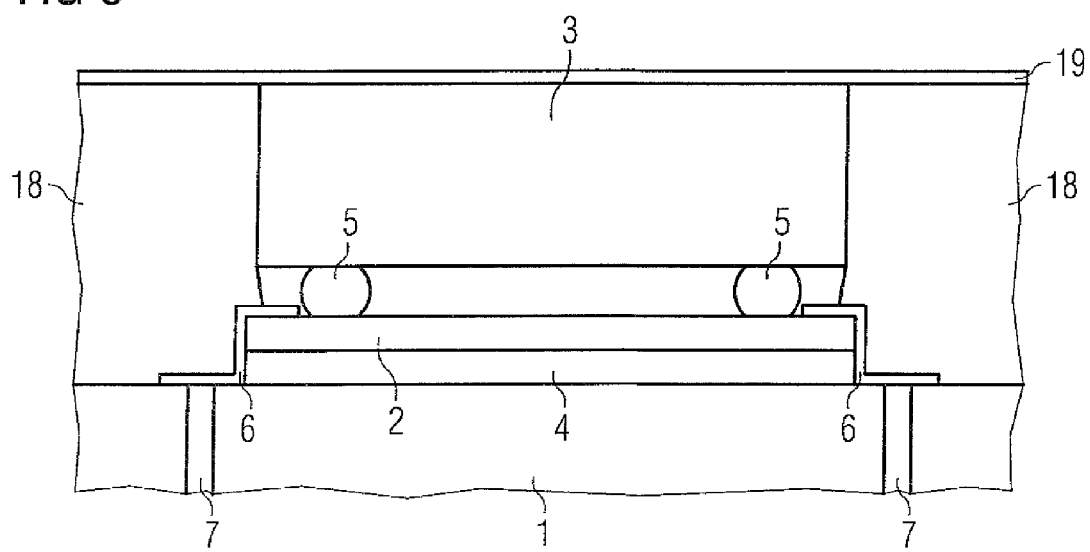
FIG. 5 shows a cross section in accordance with FIG. 4 for an embodiment with a molding compound.

FIG. 5 shows an embodiment which corresponds to FIG. 4 and in which the covering layer 8 is replaced by a filling 18 (for example a molding compound or a multilayer laminate). By means of said filling 18, the semiconductor chip arrangement can be laterally enclosed and embedded such that a larger planar surface 19 arises. A covering layer 19 can then additionally be applied to said surface as required, said covering layer being provided for an inscription, for example. In FIG. 5, the covering layer 19 is depicted as somewhat thinner than the covering layer 8 of the embodiments in FIGS. 1 to 4; however, the relative thicknesses of these layers are not fixed. The covering layer 19 can be, for example, a silicon layer having a typical thickness of approximately 100 nm. For the encapsulation of the semiconductor chip arrangement with a filling 18, it is possible, by way of example, to apply, in particular, the CSSP (chip-sized SAW package) technology known per se or to provide a similar encapsulation with a globe top known per se for this purpose.

Figure 6:
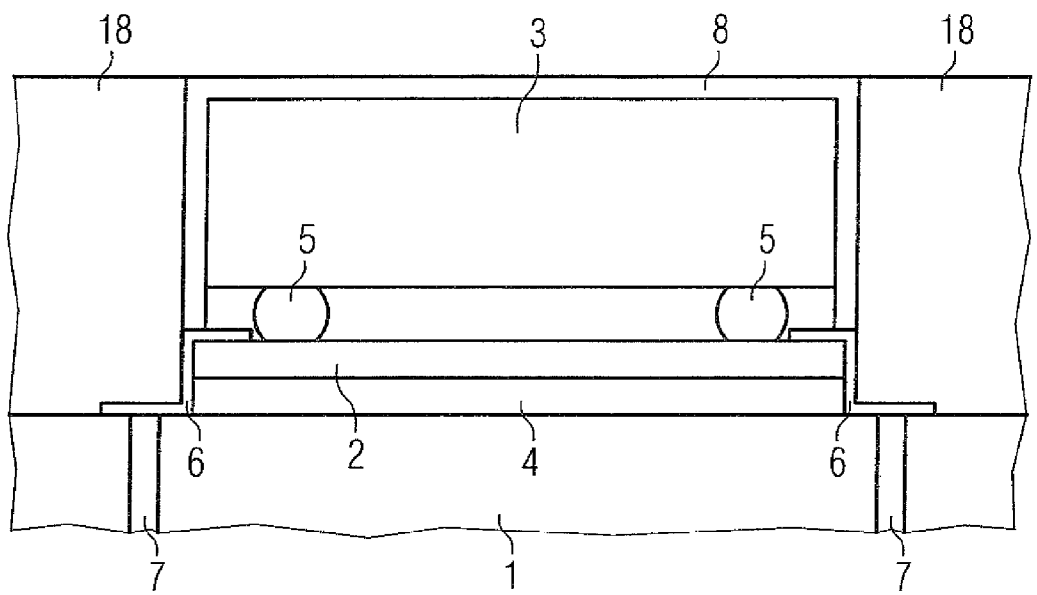
FIG. 6 shows a cross section in accordance with FIG. 4 for an embodiment with a covering layer and a molding compound.

FIG. 6 shows an embodiment wherein both a covering layer 8 and a filling 18 are present. In one advantageous configuration, the covering layer 8 is a decomposable material that can be removed selectively with respect to the filling 18. In particular, a thermally decomposable material is suitable for this purpose. The covering layer 8 can be a laminate film, for example, which is thermally stable up to typically approximately 180° C. and decomposes thermally at temperatures of more than 250° C. After the arrangement has been embedded into the filling 18, the laminate film is at least partially uncovered by the filling 18 being ground away or by the production of holes in the filling 18. In the cross section in FIG. 6, that is illustrated as an example such that the filling 18 is not present on the top side of the chip arrangement; it was not applied there or it was subsequently removed from there. In this way, the top sides of the filling 18 and of that portion of the covering layer 8 which is present above the sensor chip 3 form a continuous surface. Where the covering layer 8 is not covered, it can be completely removed by means of a thermal treatment, including the lateral portions between the sensor chip 3 and the filling 18.

Figure 7:
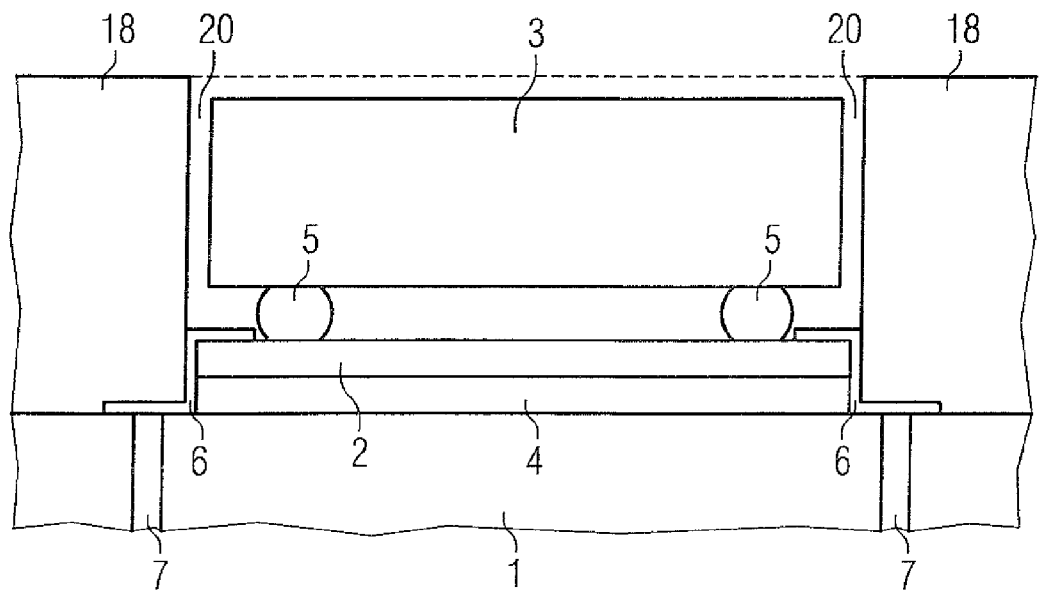
FIG. 7 shows a cross section in accordance with FIG. 6 after the removal of the covering layer.

FIG. 7 shows in cross section the product after the removal of the covering layer 8. An interspace 20 is now situated between the sensor chip 3 and the filling 18, said interspace mechanically decoupling the sensor chip 3 from the filling 18. In the case where the carrier 1 is subjected to a deformation that is not excessively great, therefore, no mechanical stress is transmitted to the sensor chip 3 via the filling 18. Only the view of the cross section within the sectional plane is illustrated in FIG. 7 for clarification purposes; in the viewing direction shown, the sidewall of the filling 18 surrounding the sensor chip 3 all around would be discernible behind the interspace 20. That is indicated in FIG. 7 by the horizontal dashed line, which marks the course of the upper edge of the filling 18 behind the plane of the drawing. In this embodiment, the semiconductor chip arrangement can, if appropriate, be sealed toward the outside and protected against environmental influences by means of a further covering being laminated thereon.

The semiconductor chip arrangement described and the associated manufacturing method make it possible to realize a substantially miniaturized arrangement composed of an ASIC chip and one or a plurality of sensor chips in which the chips are substantially protected against mechanical stresses. Moreover, sufficient protection against environmental influences can be provided. Owing to the possibility of a substantially flexible configuration of the electrical connections, this semiconductor chip arrangement can be adapted to mounting on different printed circuit boards, circuit boards, boards or the like. The arrangement additionally permits a space-saving integration of a plurality of sensors, for example for pressure and temperature.

LIST OF REFERENCE SYMBOLS

1 Carrier
2 ASIC chip
3,3' Sensor chip
4 Adhesion layer
5 Interchip connection
6 ASIC connection
7 Via
8 Covering layer
9 Insulating layer
10 Planarization layer
11 First carrier layer
12 Second carrier layer
13 Redistribution wiring plane
14 Cutout in the carrier
15 Interspace
16 Opening in the covering layer
17 Interspace
18 Filling
19 Covering layer
20 Interspace

The invention claimed is:

1. A method for manufacturing a semiconductor chip arrangement, the method comprising
    fitting an ASIC chip on a carrier by means of an adhesion layer,
    providing an ASIC connection for externally electrically connecting a circuit integrated in the ASIC chip,
    arranging a sensor chip above a top side of the ASIC chip, said top side facing away from the carrier, and is permanently connected to the ASIC chip, and
    producing an electrical connection between the sensor chip and connection contact areas on the top side of the ASIC chip, wherein the electrical connection is a direct inter-chip connection between the sensor chip and the ASIC chip wherein the electrical connection is formed by solder balls or stud bumps soldered or welded on the connection contact areas of the ASIC chip.

2. The method as claimed in claim 1, wherein
    the electrical connection between the sensor chip and the ASIC chip is produced by means of solder balls.

3. The method as claimed in claim 1, wherein
    the electrical connection between the sensor chip and the ASIC chip is produced by means of stud bumps.

4. The method as claimed in claim 1, further comprising arranging the ASIC chip in a cutout in the carrier.

5. The method as claimed in claim 1, further comprising covering the sensor chip with a decomposable covering layer and then embedded into a filling, and
    removing the covering layer to an extent such that the sensor chip is separated from the filling by an interspace.

6. The method as claimed in claim 1, further comprising applying an adhesive layer to the carrier, and
    fixing the ASIC chip on the adhesive layer, such that the adhesive layer forms the adhesion layer.

7. The method as claimed in claim 1, further comprising applying an adhesive film to the ASIC chip and
    fixing the ASIC chip on the carrier by means of the film, such that the film forms the adhesion layer.

8. The method of claim 1, wherein the sensor chip is arranged above the top side of the ASIC chip by flip-chip mounting.

9. A method for manufacturing a semiconductor chip arrangement, the method comprising
    fitting an ASIC chip on a carrier by means of an adhesion layer,
    providing an ASIC connection for externally electrically connecting a circuit integrated in the ASIC chip,
    arranging a sensor chip above a top side of the ASIC chip, said top side facing away from the carrier, and is permanently connected to the ASIC chip,
    producing a direct electrical connection between the sensor chip and the ASIC chip,
    covering the sensor chip with a decomposable covering layer and then embedded into a filling, and
    removing the covering layer to an extent such that the sensor chip is separated from the filling by an interspace.

* * * * *